United States Patent
Myong

(10) Patent No.: US 8,502,065 B2
(45) Date of Patent: Aug. 6, 2013

(54) PHOTOVOLTAIC DEVICE INCLUDING FLEXIBLE OR INFLEXIBEL SUBSTRATE AND METHOD FOR MANUFACTURING THE SAME

(75) Inventor: Seung-Yeop Myong, Seoul (KR)

(73) Assignee: KISCO (KR)

( * ) Notice: Subject to any disclaimer, the term of this patent is extended or adjusted under 35 U.S.C. 154(b) by 200 days.

(21) Appl. No.: 12/987,141

(22) Filed: Jan. 9, 2011

(65) Prior Publication Data

US 2011/0226318 A1  Sep. 22, 2011

(30) Foreign Application Priority Data

Mar. 17, 2010 (KR) .................. 10-2010-0023682

(51) Int. Cl.
H01L 31/06 (2012.01)
H01L 31/18 (2006.01)

(52) U.S. Cl.
USPC ........... 136/255; 136/256; 136/258; 136/261; 136/252; 438/72; 438/74; 438/96; 438/97; 438/57; 257/55; 257/53; 257/E31.004

(58) Field of Classification Search
USPC .................. 136/255, 252, 258, 261; 438/72, 438/74, 96, 97, 57; 257/55, 53, E31.004
See application file for complete search history.

(56) References Cited

U.S. PATENT DOCUMENTS

| | | | |
|---|---|---|---|
| 4,536,607 A * | 8/1985 | Wiesmann | 136/249 |
| 4,680,422 A * | 7/1987 | Stanbery | 136/249 |
| 4,907,052 A * | 3/1990 | Takada et al. | 257/458 |
| 5,246,506 A * | 9/1993 | Arya et al. | 136/249 |
| 2005/0145972 A1 * | 7/2005 | Fukuda et al. | 257/458 |
| 2006/0043517 A1 * | 3/2006 | Sasaki et al. | 257/458 |
| 2006/0086385 A1 * | 4/2006 | Nakano et al. | 136/255 |
| 2006/0086386 A1 * | 4/2006 | Nakano et al. | 136/255 |
| 2006/0249197 A1 * | 11/2006 | Shima et al. | 136/246 |
| 2007/0251573 A1 * | 11/2007 | Suezaki et al. | 136/258 |
| 2008/0196761 A1 * | 8/2008 | Nakano et al. | 136/258 |
| 2009/0014066 A1 * | 1/2009 | Suezaki et al. | 136/258 |
| 2009/0293936 A1 * | 12/2009 | Myong | 136/246 |
| 2010/0116331 A1 * | 5/2010 | Kobayashi et al. | 136/256 |
| 2010/0206373 A1 * | 8/2010 | Goya et al. | 136/256 |
| 2010/0243058 A1 * | 9/2010 | Meguro et al. | 136/261 |
| 2010/0313935 A1 * | 12/2010 | Coakley et al. | 136/249 |
| 2011/0073162 A1 * | 3/2011 | Kikuchi et al. | 136/246 |
| 2011/0139228 A1 * | 6/2011 | Arai et al. | 136/255 |
| 2011/0259410 A1 * | 10/2011 | Bailat et al. | 136/255 |

FOREIGN PATENT DOCUMENTS

| | | | |
|---|---|---|---|
| JP | 2001-028452 A | * | 1/2001 |
| JP | 2001-267598 A | * | 9/2001 |
| JP | 2001-308354 A | * | 11/2001 |

(Continued)

OTHER PUBLICATIONS

Yo Minkyo, JP 2001-267598 A online machine translation, translated on Nov. 16, 2012.*

Primary Examiner — Golam Mowla
(74) Attorney, Agent, or Firm — The Belles Group, P.C.

(57) ABSTRACT

Disclosed is a photovoltaic device. The photovoltaic device includes: a first electrode and a second electrode; a first unit cell and a second unit cell which are placed between the first electrode and the second electrode and include a first conductive semiconductor layer, an intrinsic semiconductor layer and a second conductive semiconductor layer; and an intermediate reflector which is placed between the first unit cell and the second unit cell, and includes a hydrogenated amorphous carbon layer.

18 Claims, 3 Drawing Sheets

FOREIGN PATENT DOCUMENTS

| | | | | |
|---|---|---|---|---|
| JP | 2002-222973 A | * | 8/2002 | |
| JP | 2002-319688 A | * | 10/2002 | |
| JP | 2002-363744 A | * | 12/2002 | |
| JP | 2003-069061 A | * | 3/2003 | |
| JP | 2003-142709 A | * | 5/2003 | |
| JP | 2003-152205 A | * | 5/2003 | |

* cited by examiner

US 8,502,065 B2

PHOTOVOLTAIC DEVICE INCLUDING FLEXIBLE OR INFLEXIBEL SUBSTRATE AND METHOD FOR MANUFACTURING THE SAME

CROSS-REFERENCE TO RELATED APPLICATION

This application claims the benefit of Korean Patent Application No. 10-2010-0023682 filed on Mar. 17, 2010, which is hereby incorporated by reference.

FIELD OF INVENTION

The present invention relates to a photovoltaic device including a flexible or inflexible substrate and a method for manufacturing the same.

BACKGROUND OF THE INVENTION

Recently, because of a high oil price and the global warming phenomenon based on a large amount of $CO_2$ emission, energy is becoming the most important issue in determining the future life of mankind. Even though many technologies using renewable energy sources including wind force, bio-fuels, a hydrogen/fuel cell and the like have been developed, a photovoltaic device using sunlight is in the spotlight in that solar energy, the origin of all energies, is an almost infinite clean energy source.

The sunlight incident on the surface of the earth has an electric power of 120,000 TW. Thus, theoretically, if a photovoltaic device having a photoelectric conversion efficiency of 10% covers only 0.16% of the land of the earth, it is possible to generate electric power of 20 TW that is twice as much as the amount of energy globally consumed during one year.

Practically, the world photovoltaic market has grown and has an annual growth rate of about 40% for the last ten years. Now, a bulk-type silicon photovoltaic device has a 90% of the photovoltaic device market share. The bulk-type silicon photovoltaic device includes a single-crystalline silicon photovoltaic device and a multi-crystalline or a poly-crystalline silicon photovoltaic device and the like. However, productivity of a solar-grade silicon wafer which is the main material of the photovoltaic device is not able to fill the explosive demand thereof, so the solar-grade silicon wafer is globally in short supply. Therefore, this shortage of the solar-grade silicon wafer is a huge threatening factor in reducing the manufacturing cost of a photovoltaic device.

Contrary to this, a thin-film silicon photovoltaic device including a light absorbing layer based on a hydrogenated amorphous silicon (a-Si:H) allows to reduce a thickness of a silicon layer equal to or less than 1/100 as large as that of a silicon wafer of the bulk-type silicon photovoltaic device. Also, it makes possible to manufacture a large area photovoltaic device at a lower cost.

Meanwhile, a single-junction thin-film silicon photovoltaic device has its own limited attainable performance. Accordingly, a double junction thin-film silicon photovoltaic device or triple junction thin-film silicon photovoltaic device having a plurality of stacked unit cells has been developed, pursuing high stabilized efficiency. Regarding the tandem-type photovoltaic device, research is being devoted to an intermediate reflector which is capable of improving efficiency by enhancing internal light reflection between the unit cells.

SUMMARY OF THE INVENTION

One aspect of this invention is a photovoltaic device. The photovoltaic device includes: a first electrode and a second electrode; a first unit cell and a second unit cell which are placed between the first electrode and the second electrode and include a first conductive semiconductor layer, an intrinsic semiconductor layer and a second conductive semiconductor layer; and an intermediate reflector which is placed between the first unit cell and the second unit cell, and includes a hydrogenated amorphous carbon layer.

Another aspect of this invention is a method for manufacturing the photovoltaic device. The method includes: forming a first electrode on a substrate; forming a first unit cell on the first electrode, the first unit cell comprising a first conductive semiconductor layer, an intrinsic semiconductor layer and a second conductive semiconductor layer: forming an intermediate reflector on the first unit cell, the intermediate reflector comprising a hydrogenated amorphous carbon layer; forming a second unit cell on the intermediate reflector, the second unit cell comprising a first conductive semiconductor layer, an intrinsic semiconductor layer and a second conductive semiconductor layer; and forming a second electrode on the second unit cell.

DETAILED DESCRIPTION

Hereinafter, embodiments of the present invention will be described in detail with reference to the accompanying drawings.

Figure 1:
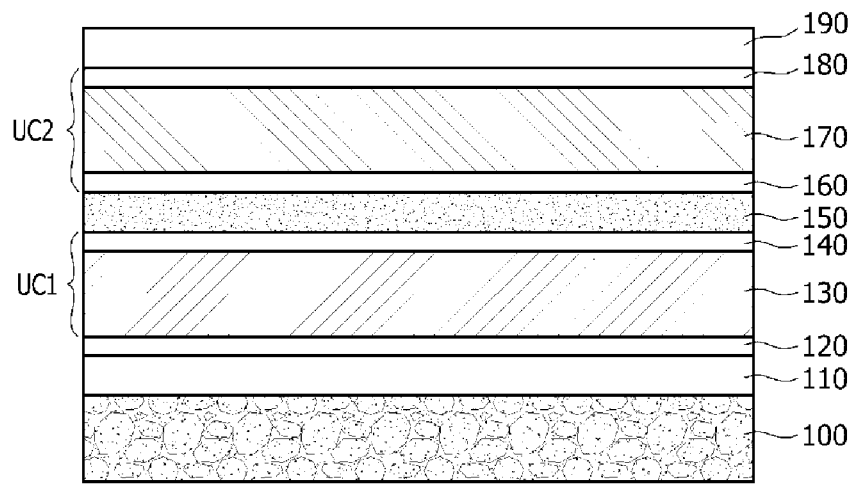
FIG. 1 shows a photovoltaic device according to an embodiment of the present invention.

FIG. 1 shows a photovoltaic device according to an embodiment of the present invention. As shown in FIG. 1, the photovoltaic device according to the embodiment of the present invention includes a substrate 100, a first electrode 110, a first unit cell UC1, an intermediate reflector 150, a second unit cell UC2 and a second electrode 190.

The substrate 100 may include a flexible substrate or an inflexible substrate. The flexible substrate is made of a flexible material such as a transparent polymer or a metallic foil. The inflexible substrate is made of an inflexible material such as glass.

The first unit cell UC1 includes a first conductive semiconductor layer 120, an intrinsic semiconductor layer 130 and a second conductive semiconductor layer 140. The second unit cell UC2 includes a first conductive semiconductor layer 160, an intrinsic semiconductor layer 170 and a second conductive semiconductor layer 180. The first unit cell UC1 and the second unit cell UC2 are placed between the first electrode 110 and the second electrode 190.

The photovoltaic device according to the embodiment of the present invention may be either a p-i-n-type photovoltaic device or an n-i-p type photovoltaic device. The p-i-n-type photovoltaic device includes a p-type semiconductor layer, an intrinsic semiconductor layer and an n-type semiconductor layer of the first unit cell UC1 and a p-type semiconductor layer, an intrinsic semiconductor layer and an n-type semiconductor layer of the second unit cell UC2 which are sequentially stacked from the substrate 100.

The n-i-p type photovoltaic device includes a p-type semiconductor layer, an intrinsic semiconductor layer and an n-type semiconductor layer of the second unit cell UC2 and a p-type semiconductor layer, an intrinsic semiconductor layer and an n-type semiconductor layer of the first unit cell UC1 which are sequentially stacked from the second electrode 190.

Here, the p-type semiconductor layer may be doped with group 3 elements. The n-type semiconductor layer may be doped with group 5 elements.

Regarding the p-i-n-type photovoltaic device, since light is incident through the substrate 100, the substrate 100 and the first electrode 110 are required to transmit light. Further, regarding the n-i-p type photovoltaic device, since light is incident through the second electrode 190, the second electrode 190 is required to transmit light.

The light transmitting first electrode 110 or the light transmitting second electrode 190 may be formed of a transparent conductive oxide such as ZnO, ITO or $SnO_2$.

Regarding the p-i-n-type photovoltaic device, since light is incident through the substrate 100, the light is incident on the second unit cell UC2 through the first unit cell UC1 closer to the substrate 100. Further, regarding the n-i-p type photovoltaic device, since light is incident through the second electrode 190, the light is incident on the first unit cell UC1 through the second unit cell UC2 closer to the second electrode 190.

An intrinsic semiconductor layer of a unit cell which is closer to the light incident side between the first unit cell UC1 and the second unit cell UC2 may be formed of a hydrogenated amorphous silicon based material having a large optical band gap in order to absorb light of a short wavelength. Further, an intrinsic semiconductor layer of a unit cell which is farther to the light incident side may be formed of a silicon germanium based material or a microcrystalline silicon based material having a small optical band gap in order to absorb light of a long wavelength.

The intermediate reflector 150 is placed between the first unit cell UC1 and the second unit cell UC2 and includes a hydrogenated amorphous carbon layer (a-C:H or a-DLC:H). Here, DLC stands for Diamond Like Carbon. The refractive index of the hydrogenated amorphous carbon layer is less than that of the intrinsic semiconductor layer of a unit cell on which light is first incident among the first unit cell UC1 and the second unit cell UC2. The optical band gap of the hydrogenated amorphous carbon layer is greater than those of the first conductive semiconductor layer and the second conductive semiconductor layer of a unit cell on which light is first incident. Accordingly, the hydrogenated amorphous carbon layer reflects the incident light to the upper cell and transmits long wavelength light or infrared light to the lower cell.

Here, the hydrogenated amorphous carbon layer has a low deposition rate. However, when the refractive index of the hydrogenated amorphous carbon layer is less than 2.0, even a thin hydrogenated amorphous carbon layer can easily generate an internal reflection. Therefore, when the thickness of the hydrogenated amorphous carbon layer is equal to or more than 1 nm and equal to or less than 20 nm, a tact, time for forming the hydrogenated amorphous carbon layer can be reduced.

In addition, the hydrogenated amorphous carbon layer may have a low dark conductivity. Thus, the intermediate reflector 150 according to the embodiment of the present invention is doped with n-type impurities such as $PH_3$ in order to compensate for the low dark conductivity. Therefore, the intermediate reflector 150 according to the embodiment of the present invention may include an n-type hydrogenated amorphous carbon layer (n-a-C:H or n-a-DLC:H). The intermediate reflector 150 including the n-type hydrogenated amorphous carbon layer (n-a-C:H or n-a-DLC:H) may have a dark conductivity which is equal to or more than $10^{-12}$ S/cm and equal to or less than $10^{-6}$ S/cm.

In order to compensate for the dark conductivity of the intermediate reflector 150, the second conductive semiconductor layer of a unit cell on which light is first incident among the first unit cell UC1 and the second unit cell UC2 may be an n-type nanocrystalline silicon layer (n-nc-Si:H). Since the n-type nanocrystalline silicon layer has an excellent vertical conductivity, it can compensate for the degradation of the dark conductivity of the intermediate reflector 150.

Meanwhile, the intermediate reflector 150 may include not only the n-type amorphous carbon layer but also the n-type nanocrystalline silicon layer contacting with a unit cell on which light is later incident among the first unit cell UC1 and the second unit cell UC2. A hydrogenated nanocrystalline silicon layer includes a crystalline silicon grain surrounded by an amorphous silicon based material or a grain boundary. The hydrogenated nanocrystalline silicon layer has a phase mixed structure in the vicinity of a phase change region where a crystalline silicon based material and an amorphous silicon based material are mixed.

For example, regarding the p-i-n-type photovoltaic device, since light is incident on the second unit cell UC2 through the first unit cell UC1, the intermediate reflector 150 may include an n-type nanocrystalline silicon layer contacting with the first conductive semiconductor layer 160 of the second unit cell UC2. Further, regarding the n-i-p type photovoltaic device, since light is incident on the first unit cell UC1 through the second unit cell UC2, the intermediate reflector 150 may include an n-type nanocrystalline silicon layer contacting with the first conductive semiconductor layer of the first unit cell UC1.

The hydrogenated amorphous carbon layer of the intermediate reflector 150 may interrupt the growth of a p-type hydrogenated microcrystalline silicon (p-μc-Si:H) of the first unit cell UC1 or the second unit cell UC2. Therefore, the n-type nanocrystalline silicon layer of the intermediate reflector 150 comes in contact with the unit cell, thereby preventing the interruption of the growth of the p-type microcrystalline silicon (p-μc-Si:H).

Such an intermediate reflector 150 may include a plurality of the hydrogenated amorphous carbon layers and a plurality of the n-type nanocrystalline silicon layers, which are alternately stacked.

In the next place, a method for manufacturing the photovoltaic device according to the embodiments of the present invention will be described with reference to the drawings.

The method for manufacturing the photovoltaic device according to the embodiments of the present invention includes a step of forming a first electrode 110 on the first substrate 100, a step of forming a first unit cell UC1 on the first electrode 110, the first unit cell UC1 including a first conductive semiconductor layer 120, an intrinsic semiconductor layer 130 and a second conductive semiconductor layer 140, a step of forming an intermediate reflector 150 on the first unit cell UC1, the intermediate reflector 150 including a hydrogenated amorphous carbon layer, a step of forming a second unit cell UC2 on the intermediate reflector 150, the second unit cell including a first conductive semiconductor layer 160, an intrinsic semiconductor layer 170 and a second conductive semiconductor layer 180, and a step of forming a second electrode 190 on the second unit cell UC2.

Figure 2:
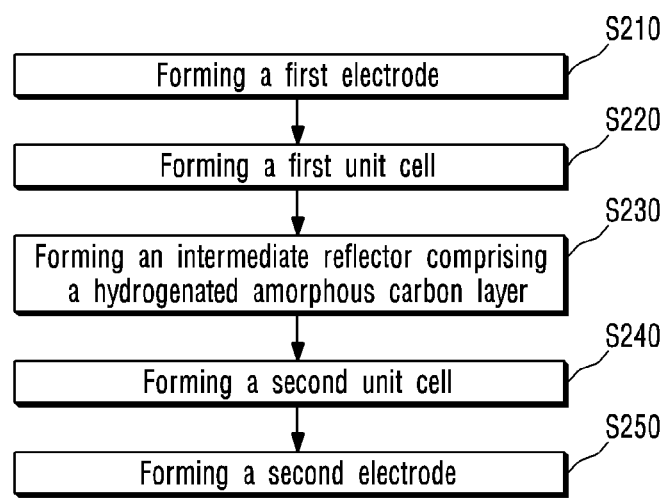
FIG. 2 shows a method for manufacturing the photovoltaic device according to a first embodiment of the present invention.

FIG. 2 shows a method for manufacturing the photovoltaic device according to a first embodiment of the present invention.

The first electrode 110 is formed on the first substrate 100 by a metal organic chemical vapor deposition (MOCVD) or a sputtering (S210).

The first conductive semiconductor layer 120, the intrinsic semiconductor layer 130 and the second conductive semiconductor layer 140 are sequentially formed on the first electrode 110 by a plasma enhanced chemical vapor deposition (PECVD) (S220). When the first unit cell UC1 and the second unit cell UC2 are the p-i-n-type unit cells, an n-type hydrogenated nanocrystalline silicon layer is formed on the intrinsic semiconductor layer 130 in such a manner as to have a thickness of equal to or more than 5 nm and equal to or less than 30 nm. When the second conductive semiconductor layer 140 of the first unit cell UC1 includes the n-type hydrogenated nanocrystalline silicon, it is possible to compensate for the dark conductivity of the intermediate reflector 150 as described above.

The intermediate reflector 150 including the hydrogenated amorphous carbon layer is formed on the first unit cell UC1 (S230). In order to form the intermediate reflector 150, hydrogen, silane and impurity gas, etc., which have been introduced into a deposition chamber for the purpose of forming the second conductive semiconductor layer 140 of the first unit cell UC1 are evacuated from the deposition chamber. Then, hydrogen, carbon source gas like $CH_4$ and impurity gas, which are necessary for forming the hydrogenated amorphous carbon layer, are introduced into the deposition chamber. When electric power is supplied to the deposition chamber, the gases in the deposition chamber enter a plasma state, and the hydrogenated amorphous carbon layer is deposited.

As described above, for the sake of preventing the hydrogenated amorphous carbon layer from interrupting the deposition of the first conductive semiconductor layer 160 of the second unit cell UC2, the n-type hydrogenated nanocrystalline silicon layer having a thickness of equal to or more than 5 nm and equal to or less than 30 nm may be formed on the hydrogenated amorphous carbon layer. When the thickness of the n-type hydrogenated nanocrystalline silicon layer is equal to or more than 5 nm, nano crystals are sufficiently formed. When the thickness of the n-type hydrogenated nanocrystalline silicon layer is equal to or less than 30 nm, it is possible to prevent light absorption caused by the increase of the thickness of the n-type hydrogenated nanocrystalline silicon layer. Before the n-type nanocrystalline silicon layer is formed, the hydrogen, carbon source gas and impurity gas and the like remaining in the deposition chamber are evacuated, and then hydrogen, silane and impurity gas and the like are introduced into the deposition chamber.

When the thickness of the hydrogenated amorphous carbon layer is equal to or more than 1 nm and equal to or less than 20 nm, the intermediate reflector 150 may include the hydrogenated amorphous carbon layers and the n-type hydrogenated nanocrystalline silicon layers, which have been alternately stacked. When the thickness of the hydrogenated amorphous carbon layer is equal to or more than 1 nm, internal reflection caused by refractive index matching may be produced. When the thickness of the hydrogenated amorphous carbon layer is equal to or less than 20 nm, it is possible to prevent excessive light absorption caused by the increase of the thickness of the intermediate reflector 150.

After the intermediate reflector 150 is formed, the second unit cell UC2 is formed (S240). When the first unit cell UC1 and the second unit cell UC2 are n-i-p type unit cells, the first conductive semiconductor layer 160 of the second unit cell UC2, which is formed of the n-type hydrogenated nanocrystalline silicon, is formed on the intermediate reflector 150. As a result, it is possible to compensate for the dark conductivity of the intermediate reflector 150.

After the second unit cell UC2 is formed, the second electrode 190 is formed (S250).

In the foregoing description, an evacuating process of the gases in the deposition chamber is performed for forming the intermediate reflector 150 and the hydrogenated nanocrystalline silicon of the unit cell. Further, the intermediate reflector 150 and the hydrogenated nanocrystalline silicon of the unit cell can be formed in one deposition chamber without the evacuating process.

That is, the second conductive semiconductor layer of a unit cell on which light is first incident among the first unit cell UC1 and the second unit cell UC2, the hydrogenated amorphous carbon layer of the intermediate reflector 150, and the hydrogenated nanocrystalline silicon layer of the intermediate reflector 150 can be formed in one deposition chamber without the evacuating process.

Figure 3:
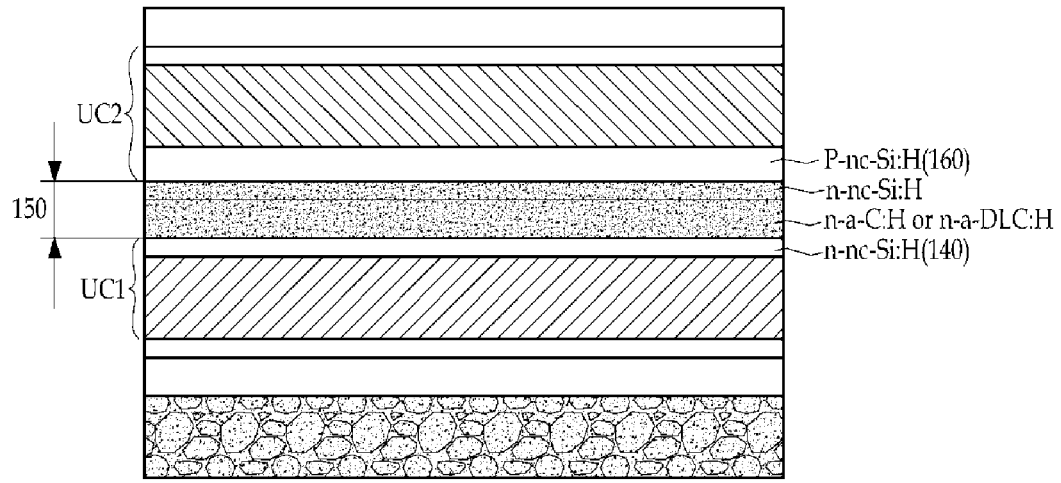
FIGS. 3 and 4 show in detail the photovoltaic device according to an embodiment of the present invention.

As shown in FIG. 3, when the first unit cell UC1 and the second unit cell UC2 are p-i-n-type unit cells, the second conductive semiconductor layer 140 of the first unit cell UC1 which is closer to the light incident side, the hydrogenated amorphous carbon layer of the intermediate reflector 150, and the n-type hydrogenated nanocrystalline silicon layer of the intermediate reflector 150 are sequentially stacked. Therefore, the second conductive semiconductor layer 140 formed of the hydrogenated nanocrystalline silicon, the hydrogenated amorphous carbon layer of the intermediate reflector 150, and the n-type hydrogenated nanocrystalline silicon layer of the intermediate reflector 150 can be formed in one deposition chamber without the evacuating process.

Figure 4:
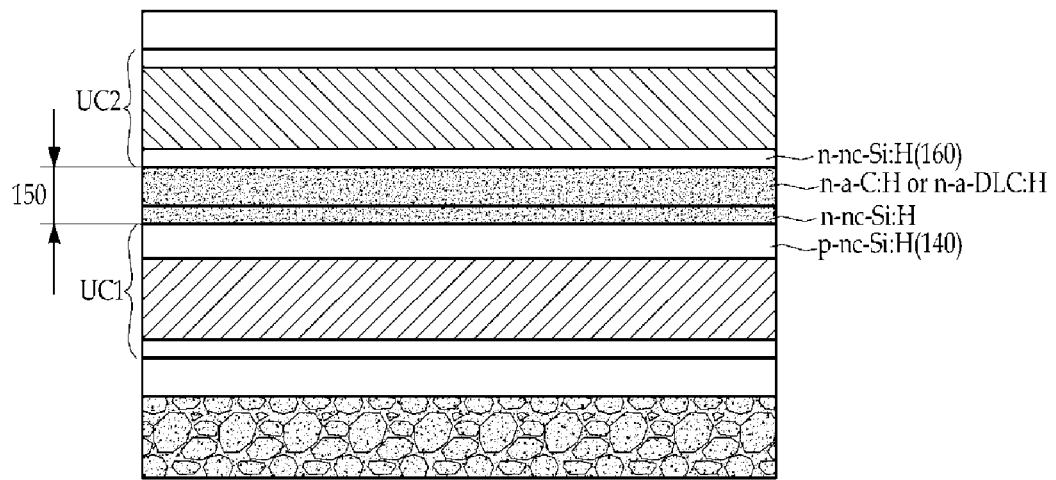

As shown in FIG. 4, when the first unit cell UC1 and the second unit cell UC2 are n-i-p type unit cells, the hydrogenated nanocrystalline silicon layer of the intermediate reflector 150, the n-type hydrogenated amorphous carbon layer of the intermediate reflector 150, and the second conductive semiconductor layer of the second unit cell UC2 which is closer to the light incident side are sequentially stacked. Therefore, the hydrogenated amorphous carbon layer of the intermediate reflector 150, the n-type hydrogenated nanocrystalline silicon layer of the intermediate reflector 150, and the second conductive semiconductor layer formed of the hydrogenated nanocrystalline silicon can be formed in one deposition chamber without the evacuating process.

As such, when the first unit cell UC1 and the second unit cell UC2 are p-i-n-type unit cells or n-i-p type unit cells, the n-type hydrogenated nanocrystalline silicon layers are placed on both sides of the hydrogenated amorphous carbon layer. Therefore, hydrogen, silane and impurity gas are introduced into the deposition chamber and electric power is supplied to the deposition chamber, and then the introduced gases enter a plasma state so that one n-type hydrogenated nanocrystalline silicon layer is formed.

Next, the silane is stopped being introduced into the deposition chamber and flow rates of the hydrogen, impurity gas and carbon source gas are adjusted again. Since the flow rates of the hydrogen, impurity gas and carbon source gas have been adjusted, the deposition chamber stands by for a time period from 10 seconds to 60 seconds until the gases in the deposition chamber are stabilized.

When the gases in the deposition chamber are stabilized, electric power is supplied to the deposition chamber. As a result, the gases in the deposition chamber enter a plasma state and the hydrogenated amorphous carbon layer is formed.

In the next place, the supply of electric power is stopped and the plasma is turned off. Further, the carbon source gas is stopped being introduced. Then, the flow rates of the hydrogen, silane and impurity gas into the deposition chamber are adjusted again. After the stand-by time passes, electric power is supplied to the deposition chamber. As a result, the gases in the deposition chamber enter a plasma state and another n-type hydrogenated nanocrystalline silicon layer may be formed on the hydrogenated amorphous carbon layer.

Meanwhile, in the manufacturing process of a tandem type photovoltaic device including a first unit cell UC1 and a second unit cell UC2, the first unit cell UC1 and the second unit cell UC2 may be formed in deposition systems different from each other. Here, a deposition system in which the first unit cell UC1 is formed may be separated from a deposition system in which the second unit cell UC2 is formed. Accordingly, after the first unit cell UC1 is formed on the substrate 100 in one deposition system, the substrate 100 on which the first unit cell UC1 has been formed may be exposed to the air during the transfer of the substrate 100 to another deposition system.

The n-type hydrogenated nanocrystalline silicon layer of the unit cell UC1 of FIG. 3 or of the intermediate reflector 150 of FIG. 4 is formed in one deposition system. The n-type hydrogenated nanocrystalline silicon layer which has been formed may be exposed to the air during the transfer of the substrate 100. Subsequently, a hydrogenated amorphous carbon layer of the intermediate reflector 150 is formed in another deposition system and the second unit cell UC2 is formed.

Not only the n-type hydrogenated nanocrystalline silicon layer of the unit cell UC1 of FIG. 3 or of the intermediate reflector 150 of FIG. 4 but also a part of the hydrogenated amorphous carbon layer of the intermediate reflector 150 are formed in one deposition system. The part of the hydrogenated amorphous carbon layer which has been formed may be exposed to the air during the transfer of the substrate 100. Subsequently, the rest of the hydrogenated amorphous carbon layer of the intermediate reflector 150 is formed in another deposition system and the second unit cell UC2 is formed.

Such an exposure to the air during the transfer of the substrate 100 after the first unit cell UC1 makes an oxide film formed on the thin film exposed to the air. As a result, the characteristic of the photovoltaic device may be deteriorated.

Accordingly, before the entire n-type hydrogenated amorphous carbon layer or the rest of the n-type hydrogenated amorphous carbon layer is formed in another deposition system, the surface of the n-type hydrogenated nanocrystalline silicon layer which has been formed or the surface of the part of the n-type hydrogenated amorphous carbon layer which has been formed may be etched. The etching process is performed in the deposition chamber of the deposition system by means of hydrogen plasma or argon plasma.

During the etching of the oxide film, since the impurities of the n-type nanocrystalline silicon layer or the n-type hydrogenated amorphous carbon layer may escape, the impurity gas is introduced into the deposition chamber in which the etching process is performed. As a result, it is possible to compensate for the impurities escaping in the etching process.

Meanwhile, when the hydrogenated amorphous carbon layer is formed, a flow ratio of the flow rate of the hydrogen gas to the flow rate of the carbon source gas can be controlled such that the refractive index of the hydrogenated amorphous carbon layer is gradually changed. In other words, a flow ratio of the flow rate of the hydrogen gas to the flow rate of the carbon source gas can be controlled such that the farther it gets to a light incident side, the less the refractive index of the hydrogenated amorphous carbon layer is.

Figure 5:
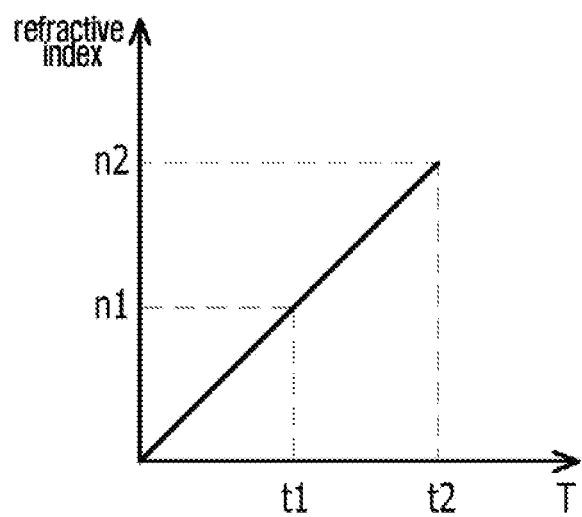
FIG. 5 shows a refractive index of an intermediate reflector of the photovoltaic device according to an embodiment of the present invention.

That is, as shown in FIG. 5, when a point "t1" within the hydrogenated amorphous carbon layer having an entire thickness of "T" is farther to a light incident side than a point "t2", the refractive index of the point "t1" may be less than that of the point "t2". In the embodiment of the present invention, as shown in FIG. 5, the refractive index linearly changes. Furthermore, the refractive index may change stepwise.

As such, as the refractive index of the hydrogenated amorphous carbon layer gradually changes, the intermediate reflector 150 more easily reflects light.

In the embodiment of the present invention, an average hydrogen content of the hydrogenated amorphous carbon layer may be equal to or more than 5 atomic % and equal to or less than 40 atomic %. When the average hydrogen content is equal to or more than 5 atomic %, dangling bonds are passivated by hydrogen so that recombination may be reduced. When the average hydrogen content is equal to or less than 40 atomic %, it is possible to prevent the stability degradation of the hydrogenated amorphous carbon layer due to the increased porosity of the hydrogenated amorphous carbon layer.

In the embodiment of the present invention, an average refractive index of the hydrogenated amorphous carbon layer may be equal to or more than 1.5 and equal to or less than 2.2 at a wavelength of 600 nm. When the average refractive index is equal to or more than 1.5, it is possible to prevent the degradation of photoelectric conversion efficiency caused by the reduction of dark conductivity. When the average refractive index is equal to or less than 2.2, enough internal reflection occurs so that the short-circuit current can be prevented from being reduced.

When the hydrogenated amorphous carbon layer is fined to a Tauc-Lorentz model by using spectroscopic ellipsometry, the optical band gap of the hydrogenated amorphous carbon layer may be equal to or more than 2.2 eV and equal to or less than 3.0 eV. According to this, the optical band gap of the hydrogenated amorphous carbon layer may be equal to or more than 2.2 eV and equal to or less than 3.0 eV. When the optical band gap of the hydrogenated amorphous carbon layer is equal to or more than 2.2 eV, it is possible to prevent the intermediate reflector 150 from excessively absorbing light. When the optical band gap of the hydrogenated amorphous carbon layer is equal to or less than 3.0 eV, the hydrogenated amorphous carbon layer is prevented from being excessively porous so that the durability of the hydrogenated amorphous carbon layer can be maintained.

When the hydrogenated amorphous carbon layer is measured by Raman spectroscopy, there is a peak corresponding to at least one of G-band and D-band at between 1200 $cm^{-1}$ and 1400 $cm^{-1}$. The crystal of the hydrogenated amorphous carbon layer has a graphite crystal structure or a diamond crystal structure. When the crystal of the hydrogenated amorphous carbon layer has a graphite crystal structure, there is a peak corresponding to G-band at between 1200 $cm^{-1}$ and 1400 $cm^{-1}$. When the crystal of the hydrogenated amorphous carbon layer has a diamond crystal structure, there is a peak corresponding to D-band at between 1200 $cm^{-1}$ and 1400 $cm^{-1}$.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A photovoltaic device comprising:
a first electrode and a second electrode;
a first unit cell and a second unit cell which are placed between the first electrode and the second electrode, wherein each of the first unit cell and the second unit cell comprises a first conductive semiconductor layer, an intrinsic semiconductor layer and a second conductive semiconductor layer; and
an intermediate reflector which is placed between the first unit cell and the second unit cell, and comprises an n-type hydrogenated amorphous carbon layer containing only hydrogen, carbon and n-type impurity;
wherein the intermediate reflector further comprises an n-type nanocrystalline silicon layer contacting with a unit cell which is farther from a light incident side between the first unit cell and the second unit cell, and
wherein a refractive index in the n-type hydrogenated amorphous carbon layer is profiled such that the farther it is from the light incident side, the larger the refractive index in the n-type hydrogenated amorphous carbon layer is.

2. The photovoltaic device of claim 1, wherein an optical band gap of the n-type hydrogenated amorphous carbon layer is larger than optical band gaps of the first conductive semiconductor layer and the second conductive semiconductor layer of a unit cell which is closer to the light incident side between the first unit cell and the second unit cell.

3. The photovoltaic device of claim 1, wherein a thickness of the n-type hydrogenated amorphous carbon layer is equal to or more than 1 nm and equal to or less than 20 nm.

4. The photovoltaic device of claim 1, wherein the second conductive semiconductor layer of a unit cell which is closer to the light incident side between the first unit cell and the second unit cell is an n-type nanocrystalline silicon layer.

5. The photovoltaic device of claim 1, wherein a thickness of the n-type nanocrystalline silicon layer is equal to or more than 5 nm and equal to or less than 30 nm.

6. The photovoltaic device of claim 1, wherein the intermediate reflector comprises at least two pairs of the n-type hydrogenated amorphous carbon layer and the n-type nanocrystalline silicon layer, wherein the n-type hydrogenated amorphous carbon layer and the n-type nanocrystalline silicon layer are alternately stacked in the intermediate reflector.

7. The photovoltaic device of claim 6, wherein a thickness of the n-type hydrogenated amorphous carbon layer is equal to or more than 1 nm and equal to or less than 20 nm.

8. The photovoltaic device of claim 1, wherein an optical band gap of the n-type hydrogenated amorphous carbon layer is equal to or more than 2.2 eV and equal to or less than 3.0 eV.

9. The photovoltaic device of claim 1, wherein, when the n-type hydrogenated amorphous carbon layer is measured by Raman spectroscopy, there is a peak corresponding to at least one of G-band and D-band at between 1200 $cm^{-1}$ and 1400 $cm^{-1}$.

10. The photovoltaic device of claim 1, wherein the refractive index of the n-type hydrogenated amorphous carbon layer is equal to or more than 1.5 and equal to or less than 2.2 at a wavelength of 600 nm.

11. The photovoltaic device of claim 1, wherein an average hydrogen content of the n-type hydrogenated amorphous carbon layer is equal to or more than 5 atomic % and equal to or less than 40 atomic %.

12. A photovoltaic device comprising:
a first electrode and a second electrode;
a first unit cell and a second unit cell which are placed between the first electrode and the second electrode, wherein each of the first unit cell and the second unit cell comprising a p-type conductive semiconductor layer, an intrinsic semiconductor layer, and an n-type conductive semiconductor layer; and
an intermediate reflector which is placed between the first unit cell and the second unit cell, wherein the intermediate reflector comprising two layers including an n-type hydrogenated amorphous carbon layer and an n-type nanocrystalline silicon layer, the n-type hydrogenated amorphous carbon layer contains only hydrogen, carbon and n-type impurity;
wherein the n-type nanocrystalline silicon layer of the intermediate layer directly contacts the p-type conductive semiconductor layer of one of the first and second unit cells, and the n-type hydrogenated amorphous carbon layer of the intermediate layer directly contacts the n-type conductive semiconductor of the other of the first and second unit cell, and
wherein a refractive index in the n-type hydrogenated amorphous carbon layer of the intermediate reflector is profiled such that the farther it is from a light incident side, the larger the refractive index is in the n-type hydrogenated amorphous carbon layer.

13. The photovoltaic device of claim 12, wherein the intrinsic semiconductor layer of the first unit cell is made of a material having a larger optical band gap for absorbing light of a short wavelength and the intrinsic semiconductor layer of the second unit cell is made of a material having a small optical band gap for absorbing light of a long wavelength.

14. The photovoltaic device of claim 13, wherein the intrinsic semiconductor layer of the first unit cell is made of hydrogenated amorphous silicon based material and the intrinsic semiconductor layer of the second unit cell is made of silicon germanium or microcrystalline silicon based material.

15. The photovoltaic device of claim 12, wherein when light is first incident on the first unit cell, the n-type conductive semiconductor layer of the first unit cell is made of an n-type nanocrystalline silicon layer to compensate for low dark conductivity of the n-type hydrogenated amorphous carbon layer of the intermediate layer.

16. The photovoltaic device of claim 15, wherein the low dark conductivity is equal to or more than $10^{-12}$ S/cm and equal to or less than $10^{-6}$ S/cm.

17. A photovoltaic device comprising:
a substrate defining a light incident side of the photovoltaic device;
a first electrode formed on the substrate;
a first unit cell comprising a first p-type conductive semiconductor layer formed on the first electrode, a first intrinsic semiconductor layer formed on the first p-type semiconductor layer, and a first n-type conductive semiconductor layer formed on the first intrinsic semiconductor layer;
an intermediate reflector comprising an n-type hydrogenated amorphous carbon layer formed directly on the first n-type conductive semiconductor layer of the first unit cell and an n-type nanocrystalline silicon layer formed directly on the n-type hydrogenated amorphous carbon layer, wherein the n-type hydrogenated amorphous carbon layer contains only hydrogen, carbon and n-type impurity;

a second unit cell comprising a second p-type conductive semiconductor layer formed directly on the n-type nanocrystalline silicon layer of the intermediate reflector, a second intrinsic semiconductor layer formed on the second p-type semiconductor layer, and a second n-type conductive semiconductor layer formed on the second intrinsic semiconductor layer; and a second electrode formed on the second n-type conductive semiconductor layer of the second unit cell;

wherein a refractive index of the n-type hydrogenated amorphous carbon layer of the intermediate reflector is profiled such that the farther it is from the light incident side, the larger the refractive index is in the n-type hydrogenated amorphous carbon layer.

18. The photovoltaic device of claim 17, wherein the first intrinsic semiconductor layer of the first unit cell is made of hydrogenated amorphous silicon based material and the second intrinsic semiconductor layer of the second unit cell is made of silicon germanium or microcrystalline silicon based material.

\* \* \* \* \*